United States Patent
Koreeda

(10) Patent No.: US 10,951,196 B2
(45) Date of Patent: Mar. 16, 2021

(54) MULTIPLEXER, HIGH-FREQUENCY FRONT-END CIRCUIT, AND COMMUNICATION DEVICE

(71) Applicant: Murata Manufacturing Co., Ltd., Nagaokakyo (JP)

(72) Inventor: Toshishige Koreeda, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 16/551,772

(22) Filed: Aug. 27, 2019

(65) Prior Publication Data
US 2019/0393863 A1    Dec. 26, 2019

Related U.S. Application Data

(63) Continuation of application No. PCT/JP2018/008527, filed on Mar. 6, 2018.

(30) Foreign Application Priority Data

Apr. 5, 2017   (JP) .............................. JP2017-075233

(51) Int. Cl.
| | |
|---|---|
| *H03H 9/72* | (2006.01) |
| *H03H 9/205* | (2006.01) |
| *H03H 9/54* | (2006.01) |
| *H03H 9/64* | (2006.01) |
| *H03F 3/189* | (2006.01) |

(52) U.S. Cl.
CPC ............ *H03H 9/725* (2013.01); *H03F 3/189* (2013.01); *H03H 9/205* (2013.01); *H03H 9/54* (2013.01); *H03H 9/6483* (2013.01)

(58) Field of Classification Search
CPC .......... H03H 9/725; H03H 9/205; H03H 9/54; H03H 9/6483
See application file for complete search history.

(56) References Cited

U.S. PATENT DOCUMENTS

| | | |
|---|---|---|
| 2003/0214368 A1 | 11/2003 | Taniguchi |
| 2012/0286896 A1 | 11/2012 | Takamine |
| (Continued) | | |

FOREIGN PATENT DOCUMENTS

| | | |
|---|---|---|
| JP | 2003-332885 A | 11/2003 |
| JP | 2011-139316 A | 7/2011 |
| (Continued) | | |

OTHER PUBLICATIONS

Official Communication issued in International Patent Application No. PCT/JP2018/008527, dated May 29, 2018.

*Primary Examiner* — Samuel S Outten
(74) *Attorney, Agent, or Firm* — Keating & Bennett, LLP

(57) ABSTRACT

A multiplexer includes a first filter that is a ladder elastic wave filter including series-arm resonators and parallel-arm resonators, a second filter connected to the first filter at a common connection point, and a board including an inductor pattern defining an inductor connected in parallel with the series-arm resonator, and a ground pattern provided in the layer in which the inductor pattern is provided, so as to be disposed at a distance from and adjacent to the inductor pattern. A minimum distance between the inductor pattern and the ground pattern is not greater than about 1.55 times a minimum pattern width in the ground pattern.

20 Claims, 4 Drawing Sheets

(56) References Cited

U.S. PATENT DOCUMENTS

| | | | |
|---|---|---|---|
| 2013/0106530 A1 | 5/2013 | Tajima et al. | |
| 2015/0155850 A1* | 6/2015 | Kuzushita | H03H 9/568 |
| | | | 333/133 |
| 2016/0322956 A1 | 11/2016 | Takeuchi et al. | |
| 2018/0041194 A1* | 2/2018 | Ito | H03H 9/706 |

FOREIGN PATENT DOCUMENTS

| | | | |
|---|---|---|---|
| JP | 2013-098804 A | 5/2013 | |
| WO | 2011/092879 A1 | 8/2011 | |
| WO | 2015/104882 A1 | 7/2015 | |

* cited by examiner

MULTIPLEXER, HIGH-FREQUENCY FRONT-END CIRCUIT, AND COMMUNICATION DEVICE

CROSS REFERENCE TO RELATED APPLICATIONS

This application claims the benefit of priority to Japanese Patent Application No. 2017-075233 filed on Apr. 5, 2017 and is a Continuation Application of PCT Application No. PCT/JP2018/008527 filed on Mar. 6, 2018. The entire contents of each application are hereby incorporated herein by reference.

BACKGROUND OF THE INVENTION

1. Field of the Invention

The present invention relates to a multiplexer including a plurality of filters connected with a common connection point, a high-frequency front-end circuit, and a communication device.

2. Description of the Related Art

With respect to recent cellular phones, there has been a demand for a single terminal that supports a plurality of frequency bands and a plurality of wireless modes, which are termed multiband compatibility and multimode compatibility. To respond to this demand, directly next to one antenna, a multiplexer is disposed that includes a first filter and a second filter that are connected with a common connection point and pass signals of frequency bands different from each other.

The first filter is, for example, a ladder elastic wave filter including a series-arm resonator and a parallel-arm resonator, and an inductor is connected in parallel with the series-arm resonator (see Japanese Unexamined Patent Application Publication No. 2003-332885, for example). Thus, an anti-resonance point of the series-arm resonator can be adjusted, and isolation characteristics between the first filter and the second filter can be improved.

In Japanese Unexamined Patent Application Publication No. 2003-332885, however, the improvement in isolation characteristics is insufficient, and further improvement in isolation characteristics is necessary.

SUMMARY OF THE INVENTION

Preferred embodiments of the present invention provide multiplexers, high-frequency front-end circuits, and communication devices that each enable further improvement in isolation characteristics.

A multiplexer according to a preferred embodiment of the present invention includes a first filter that is a ladder elastic wave filter including a series-arm resonator and a parallel-arm resonator; a second filter connected to the first filter at a common connection point; and a board including an inductor pattern defining an inductor connected in parallel with the series-arm resonator, and a ground pattern provided, in the same layer in which the inductor pattern is provided, so as to be disposed at a distance from and adjacent to the inductor pattern. A minimum distance between the inductor pattern and the ground pattern is not greater than about 1.55 times a minimum pattern width in the ground pattern.

Thus, the minimum distance between the inductor pattern and the ground pattern is not greater than about 1.55 times the minimum pattern width in the ground pattern, such that the minimum distance is able to decrease, and a sufficient capacitance component is therefore able to be obtained by coupling between the inductor pattern and the ground pattern. Thus, an anti-resonance point of the series-arm resonator is able to be adjusted further by LC resonance caused by the capacitance component and an inductance component of the inductor pattern, and an isolation between the first filter and the second filter in a pass band of the second filter is therefore able to be improved further. Furthermore, as the minimum distance decreases, the area of the ground pattern is able to increase, and an isolation between the first filter and the second filter in a pass band of the first filter is therefore able to be improved further. Thus, isolation characteristics between the first filter and the second filter are able to be improved further.

Furthermore, the inductor pattern may include a plurality of linear wiring patterns, and at least two linear wiring patterns of the plurality of linear wiring patterns may be disposed individually at the minimum distance from and adjacent to the ground pattern.

Thus, each of the minimum distances between the at least two linear wiring patterns and the ground pattern is not greater than about 1.55 times the minimum pattern width, a capacitance component to be obtained is therefore able to be made larger, and the area of the ground pattern is also able to be made larger.

Furthermore, the inductor pattern and the ground pattern may be provided in the board over a plurality of layers, and, in each of the plurality of layers, the inductor pattern and the ground pattern may be disposed at the minimum distance from and adjacent to each other.

Thus, in each of the plurality of layers over which the inductor pattern and the ground pattern are provided, the minimum distance between the inductor pattern and the ground pattern is not greater than about 1.55 times the minimum pattern width, a capacitance component to be obtained is therefore able to be made larger, and the area of the ground pattern is also able to be made larger.

Furthermore, the minimum distance may be not less than about 0.1 times the minimum pattern width.

Thus, for example, when the minimum distance between the inductor pattern and the ground pattern is exceedingly narrow, electrical conduction is likely to occur between the inductor pattern and the ground pattern, whereas, since the minimum distance is not less than about 0.1 times the minimum pattern width, a capacitance component to be obtained is able to be made larger, and the area of the ground pattern is also able to be made larger, while reducing or preventing the occurrence of electrical conduction between the inductor pattern and the ground pattern.

A high-frequency front-end circuit according to a preferred embodiment of the present invention includes a multiplexer described above, and an amplifier circuit connected to the multiplexer.

Thus, the high-frequency front-end circuit enables further improvement in isolation characteristics.

A communication device according to a preferred embodiment of the present invention includes an RF signal processing circuit configured to process radio frequency signals to be transmitted and having been received by an antenna element, and a high-frequency front-end circuit described above that is configured to transmit the radio frequency signals between the antenna element and the RF signal processing circuit.

Thus, the communication device enables further improvement in isolation characteristics.

The multiplexers, the high-frequency front-end circuits, and the communication devices according to preferred embodiments of the present invention enable further improvement in isolation characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
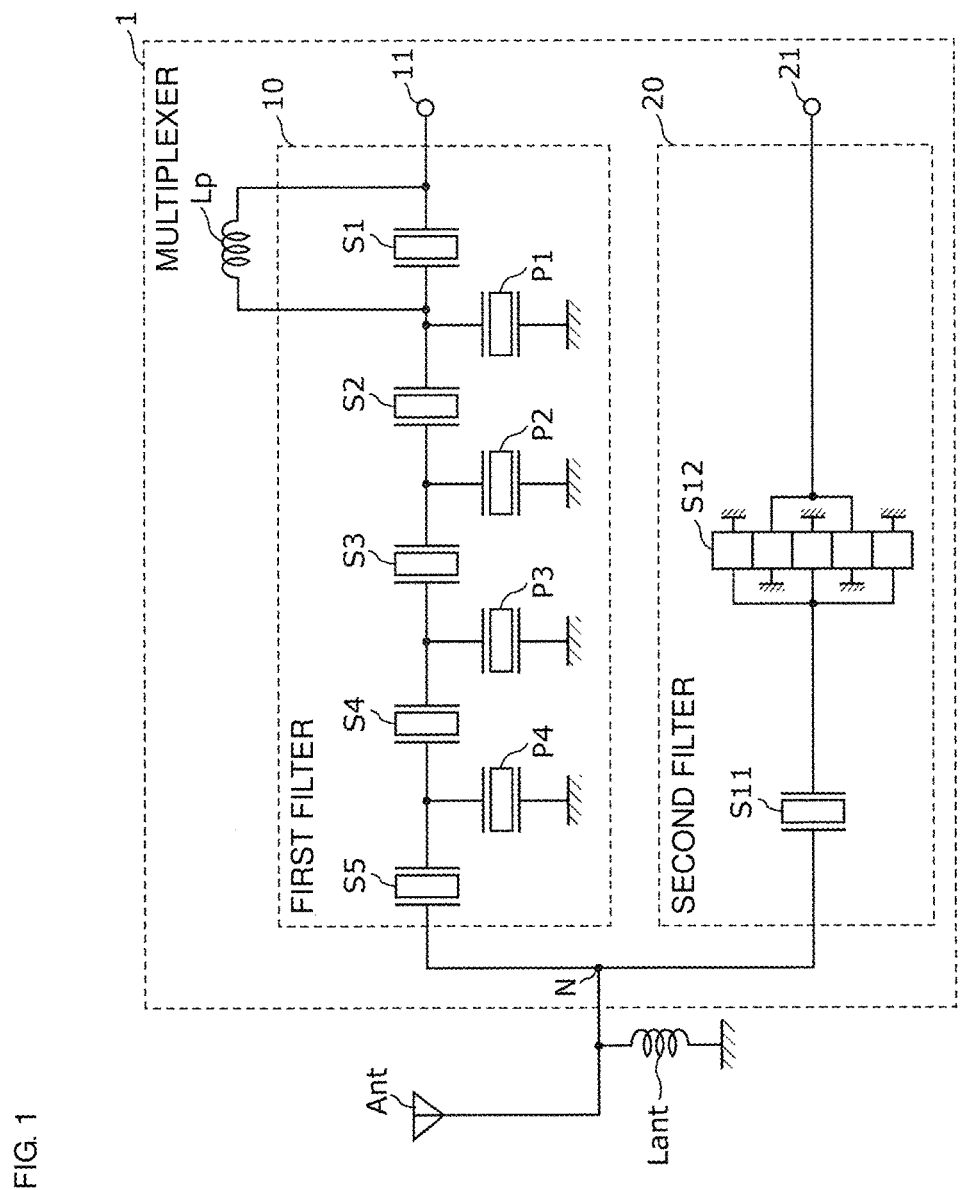
FIG. 1 illustrates a circuit configuration of a multiplexer according to a Preferred Embodiment 1 of the present invention.

Preferred embodiments of the present invention will be described in detail below with reference to the drawings. Note that all of the preferred embodiments described below describe general or specific examples. Numerical values, shapes, materials, components, the arrangement and connection configuration of the components, and the like that are described in the following preferred embodiments are merely examples and are not intended to limit the scope of the present invention. Among the components in the following preferred embodiments, a component not described in an independent claim is described as an optional component. Furthermore, the size of a component illustrated in the drawings is not necessarily exact. In each figure, components that are the same or substantially the same are denoted by the same reference numerals, and repeated descriptions thereof are omitted or simplified in some cases.

Preferred Embodiment 1

FIG. 1 illustrates a circuit configuration of a multiplexer 1 according to a Preferred Embodiment 1 of the present invention. As illustrated in FIG. 1, the multiplexer 1 includes a first filter 10, a second filter 20, an inductor Lp, a matching inductor Lant, and input-output terminals 11 and 21. Although not illustrated in FIG. 1, the multiplexer 1 includes a board 30, and the inductor Lp is defined by an inductor pattern provided in the board 30. The board 30 will be described in detail with reference to FIG. 2 described later. Hereinafter, the inductor Lp is also referred to as an inductor pattern Lp. Furthermore, FIG. 1 illustrates a common connection point N of the first filter 10 and the second filter 20. FIG. 1 also illustrates an antenna element ANT, which is not a component of the multiplexer 1. The antenna element ANT is preferably, for example, a multiband-compatible antenna that is compliant with a communication standard, such as LTE (Long Term Evolution), in which radio frequency signals are transmitted and received.

The first filter 10 is a ladder elastic wave filter that includes series-arm resonators S1 to S5 connected to a series arm connecting the common connection point N and the input-output terminal 11, and parallel-arm resonators P1 to P4 connected to parallel arms connecting the series arm and the ground. A band pass filter having a first pass band is defined by the series-arm resonators S1 to S5 and the parallel-arm resonators P1 to P4. In the present preferred embodiment, the first pass band preferably ranges, for example, from about 1920 MHz to about 1980 MHz. The series-arm resonators S1 to S5 and the parallel-arm resonators P1 to P4 are preferably, for example, SAW (Surface Acoustic Wave) resonators. In the case where the first filter 10 is a SAW filter defined by a SAW resonator, the first filter 10 includes a substrate and an IDT (InterDigital Transducer) electrode. The substrate has piezoelectricity on at least a surface thereof. The substrate includes, for example, a piezoelectric thin film on the surface and may be a multilayer body including a film whose acoustic velocity is different from that of the piezoelectric thin film, a supporting substrate, and the like. The substrate may be, for example, a multilayer body including a high acoustic velocity supporting substrate and a piezoelectric thin film provided on the high acoustic velocity supporting substrate, a multilayer body including a high acoustic velocity supporting substrate, a low acoustic velocity film provided on the high acoustic velocity supporting substrate, and a piezoelectric thin film provided on the low acoustic velocity film, or a multilayer body including a supporting substrate, a high acoustic velocity film provided on the supporting substrate, a low acoustic velocity film provided on the high acoustic velocity film, and a piezoelectric thin film provided on the low acoustic velocity film. Furthermore, the substrate may have piezoelectricity throughout the entire substrate. Alternatively, these resonators may be elastic wave resonators using boundary acoustic wave or BAW (Bulk Acoustic Wave).

The first filter 10 is provided, for example, in a transmission signal path, and the input-output terminal 11 is connected to an RF signal processing circuit, for example, through a transmission power amplifier. Alternatively, the first filter 10 may be provided in a reception signal path, and the input-output terminal 11 may be connected to the RF signal processing circuit through a reception low noise amplifier.

The inductor pattern Lp is connected in parallel, for example, with the series-arm resonator S1 connected to the input-output terminal 11 of the series-arm resonators S1 to S5. Thus, an anti-resonance point of the series-arm resonator S1 is able to be adjusted. The inductor pattern Lp may be connected in parallel with any series-arm resonator of the series-arm resonators S1 to S5. Furthermore, the multiplexer 1 may include a plurality of inductor patterns Lp, and the inductor patterns Lp may be connected in parallel with two or more respective series-arm resonators of the series-arm resonators S1 to S5.

The first filter 10 preferably includes, but is not limited to, five series-arm resonators S1 to S5 and four parallel-arm resonators P1 to P4, for example. The first filter 10 need only include at least one series-arm resonator and at least one parallel-arm resonator.

The second filter 20 is disposed between the common connection point N and the input-output terminal 21 and has a pass band (second pass band) different from the first pass band and is connected to the first filter 10 at the common connection point N. Thus, the multiplexer 1 provides multiband compatibility and multimode compatibility. The second filter 20 is preferably, for example, a longitudinally coupled filter including a series-arm resonator S11 and a longitudinally coupled resonator S12, and a band pass filter having the second pass band different from the first pass band is defined by the series-arm resonator S11 and the longitudinally coupled resonator S12. In the present preferred embodiment, the second pass band is a higher band than the first pass band and preferably ranges, for example, from about 2110 MHz to about 2170 MHz. The second filter 20 does not have to be the longitudinally coupled filter. For example, the second filter 20 may be a ladder elastic wave filter as in the first filter 10, or alternatively, does not have to include any elastic wave resonator as in an LC resonant circuit.

The second filter 20 is preferably provided, for example, in the reception signal path, and the input-output terminal 21 is connected to the RF signal processing circuit, for example, through the reception low noise amplifier. The second filter 20 may be provided in the transmission signal path, and the input-output terminal 21 may be connected to the RF signal processing circuit through the transmission power amplifier.

The matching inductor Lant is connected between the common connection point N and the ground. Thus, impedance matching between the antenna element ANT and the first filter 10 and impedance matching between the antenna element ANT and the second filter 20 are able to be performed.

Next, wiring layouts in the board 30 will be described with reference to FIG. 2.

Figure 2:
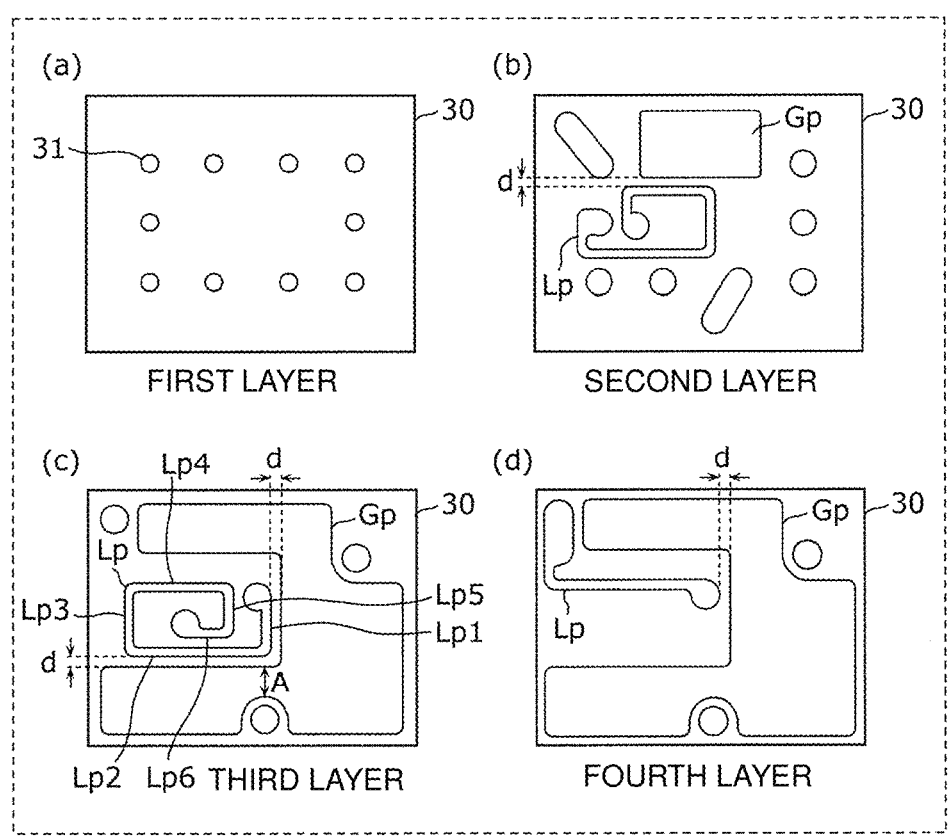
FIG. 2 illustrates wiring layouts of a plurality of layers defining a board according to the Preferred Embodiment 1 of the present invention.

FIG. 2 illustrates wiring layouts of a plurality of layers of the board 30 according to the Preferred Embodiment 1. The board 30 is preferably, for example, a PCB (Printed Circuit Board) and a multilayer board including the plurality of layers. The board 30 preferably includes, for example, six layers, and parts (a) to (d) of FIG. 2 illustrate wiring layouts of first to fourth layers. Illustrations of wiring layouts of fifth and sixth layers are omitted. Furthermore, the number of layers in the board 30 is not limited to six and may be any suitable number.

As illustrated in part (a) of FIG. 2, in the first layer of the board 30, for example, bumps 31 are provided, a piezoelectric chip or the like defining the first filter 10 is mounted on the bumps 31, and the board 30 (inductor pattern Lp) and the first filter 10 (series-arm resonator S1) are thus connected in parallel with each other.

The board 30 includes the inductor pattern Lp, and a ground pattern Gp provided, in the same layer in which the inductor pattern Lp is provided, so as to be disposed a distance from and adjacent to the inductor pattern Lp. As illustrated in parts (b) to (d) of FIG. 2, the inductor pattern Lp and the ground pattern Gp are provided in the board 30, for example, over a plurality of layers (the second to fourth layers). The inductor pattern Lp preferably has a helical shape, for example, in which wiring patterns provided on the plurality of layers are connected by interlayer conductors (via conductors). The ground pattern Gp is provided in the board 30 over the plurality of layers by connecting solid patterns provided on the plurality of layers with interlayer conductors (via conductors).

A minimum distance d between the inductor pattern Lp and the ground pattern Gp is preferably, for example, not greater than about 1.55 times a minimum pattern width A in the ground pattern Gp. The minimum pattern width A is, for example, a width of a portion having a narrowest pattern width of the ground pattern Gp provided over the plurality of layers. In the present preferred embodiment, as illustrated in part (c) of FIG. 2, there is a portion having the minimum pattern width A in the third layer. Furthermore, the minimum distance d is, for example, a distance of a portion having a narrowest distance between the inductor pattern Lp and the ground pattern Gp adjacent to each other that are provided over the plurality of layers. In the present preferred embodiment, as illustrated in parts (b) to (d) of FIG. 2, there is a portion having the minimum distance d in each of the second to fourth layers.

When the minimum distance d between the inductor pattern Lp and the ground pattern Gp adjacent to each other is not greater than about 1.55 times the minimum pattern width A, a sufficient capacitance component is able to be obtained by coupling between the inductor pattern Lp and the ground pattern Gp, and the area of the ground pattern Gp is also able to increase by the amount by which the minimum distance d decreases. Here, while focusing on the third layer of the board 30, the arrangement of the inductor pattern Lp and the ground pattern Gp in the same layer will be described.

As illustrated in part (c) of FIG. 2, in the third layer of the board 30, the inductor pattern Lp includes a plurality of linear wiring patterns Lp1 to Lp6 so as to have a flat-coil shape. At this time, at least two linear wiring patterns of the plurality of linear wiring patterns Lp1 to Lp6 are disposed individually at the minimum distance d from and adjacent to the ground pattern Gp. In the present preferred embodiment, the at least two linear wiring patterns that are at the minimum distance d from and adjacent to the ground pattern Gp are the wiring patterns Lp1 and Lp2. Thus, the minimum distance d between the wiring pattern Lp1 and the ground pattern Gp is not greater than about 1.55 times the minimum pattern width A, and the minimum distance d between the wiring pattern Lp2 and the ground pattern Gp is not greater than about 1.55 times the minimum pattern width A. For example, the minimum distance d is preferably about 20 µm, and the minimum pattern width A is preferably about 186 µm. Thus, the minimum distance is about 0.1075 times the minimum pattern width A.

Therefore, each of the minimum distances d between at least two linear wiring patterns (wiring patterns Lp1 and Lp2 herein) and the ground pattern Gp is not greater than about 1.55 times the minimum pattern width A, a capacitance component to be obtained is therefore able to be increased further, and the area of the ground pattern Gp is also able to be increased.

Furthermore, as illustrated in parts (b) and (d) of FIG. 2, in the second and fourth layers as well as the third layer, the minimum distance d between the inductor pattern Lp and the ground pattern Gp is not greater than about 1.55 times the minimum pattern width A.

Next, characteristics of the multiplexer 1 in the present preferred embodiment will be described with reference to FIGS. 3A and 3B.

Figure 3A:
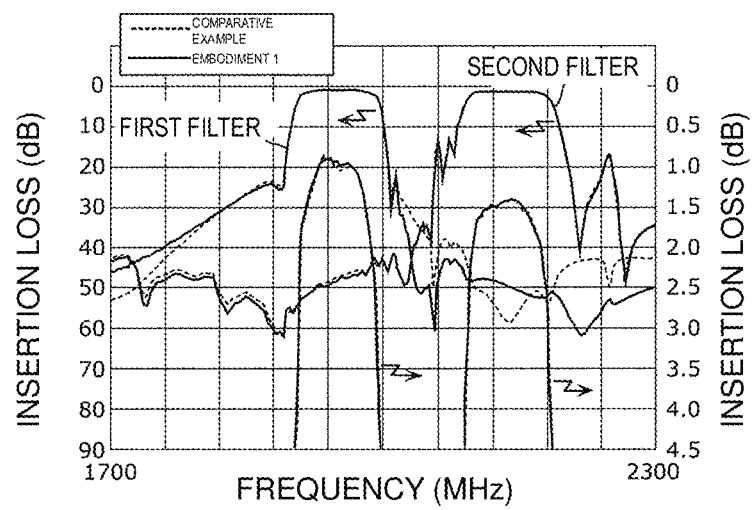
FIG. 3A illustrates bandpass characteristics of a first filter and a second filter according to the Preferred Embodiment 1 of the present invention.
Figure 3B:
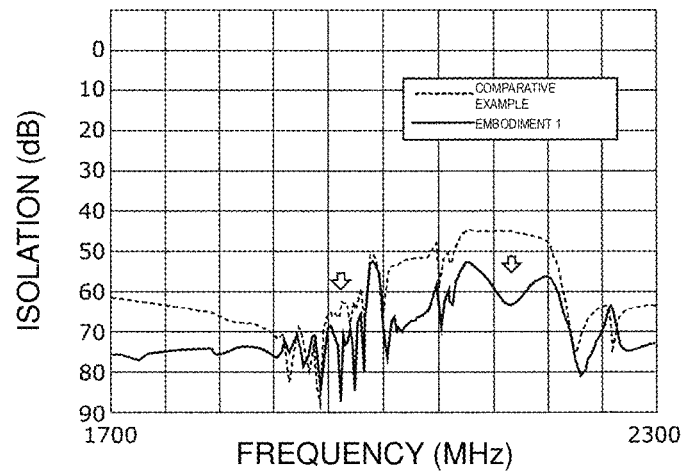
FIG. 3B illustrates isolation characteristics between the first filter and the second filter according to the Preferred Embodiment 1 of the present invention.

FIG. 3A illustrates bandpass characteristics of the first filter 10 and the second filter 20 according to the Preferred Embodiment 1. In FIG. 3A, a solid line represents a bandpass characteristic in the present preferred embodiment and represents a characteristic in the case where the minimum distance d is preferably about 0.1075 times the minimum pattern width A, for example. As described above, the minimum distance d is about 20 µm, and the minimum pattern width A is about 186 µm, for example. On the other hand, a dashed line represents a bandpass characteristic in a comparative example and represents a characteristic in the case where the minimum distance d is about 195 μm and the minimum pattern width A is about 11 μm, that is, in the case where the minimum distance d is about 17.7273 times the minimum pattern width A.

In the case of the Preferred Embodiment 1 in which the minimum distance d is about 0.1075 times the minimum pattern width A, a sufficient capacitance component is able to be obtained by coupling between the inductor pattern Lp and the ground pattern Gp, and an anti-resonance point of the series-arm resonator is able to be adjusted by LC resonance caused by the capacitance component and an inductance component of the inductor pattern Lp.

For example, it is considered that, when the anti-resonance point of the series-arm resonator is adjusted, an attenuation or a frequency in an attenuation band of the first filter 10 is able to be changed, and isolation characteristics are able to be improved. Thus, as illustrated in FIG. 3B, in the case of the Preferred Embodiment 1 (solid line) in which the ground pattern Gp is sufficiently close to the inductor pattern Lp in comparison with the comparative example (dashed line), it is seen that isolation characteristics between the first filter 10 and the second filter 20 (specifically, a bandpass characteristic from the input-output terminal 11 to the input-output terminal 21) in the second pass band (the vicinity of about 2110 MHz to about 2170 MHz) of the second filter 20 are improved.

Furthermore, it is seen that isolation characteristics between the first filter 10 and the second filter 20 in the first pass band (the vicinity of about 1920 MHz to about 1980 MHz, for example) of the first filter 10 are improved. This is because, as the area of the ground pattern Gp increases, an attenuation of the second filter 20 in the first pass band increases and isolation characteristics are therefore improved.

In the present preferred embodiment, preferably, the minimum distance d is about 20 μm, the minimum pattern width A is about 186 μm, and a ratio d/A of the minimum distance d to the minimum pattern width A is about 0.1075. However, these parameters are examples, and the ratio d/A only needs to be not greater than about 1.55 (that is, the minimum distance d only needs to be not greater than about 1.55 times the minimum pattern width A). Another example of the ratio d/A will be described below. An example in the case where the ratio d/A is greater than about 1.55 will also be provided.

Table 1 illustrates isolations obtained when the ratio d/A is changed (specifically, when the minimum distance d and the minimum pattern width A are changed). Furthermore, RxISO represents an isolation between the first filter 10 and the second filter 20 in the second pass band, and TxISO represents an isolation between the first filter 10 and the second filter 20 in the first pass band.

TABLE 1

| d [μm] | A [μm] | d/A | RxISO [dB] | TxISO [dB] |
|---|---|---|---|---|
| 20 | 186 | 0.1075 | 55.6 | 65.4 |
| 50 | 156 | 0.3205 | 51.4 | 65.5 |
| 75 | 131 | 0.5725 | 49.5 | 63.8 |
| 100 | 106 | 0.9434 | 48.2 | 62.1 |
| 125 | 81 | 1.5432 | 47.2 | 62.0 |
| 150 | 56 | 2.6786 | 46.4 | 58.9 |
| 175 | 31 | 5.6452 | 45.8 | 58.6 |
| 195 | 11 | 17.7273 | 45.1 | 58.1 |

Figure 4:
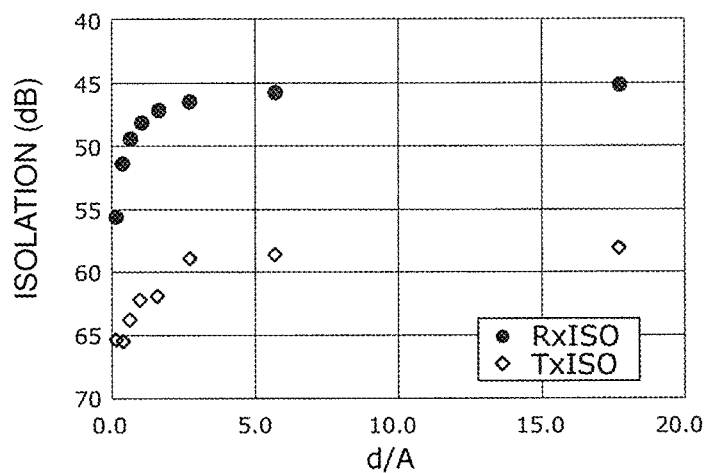
FIG. 4 illustrates an isolation obtained when a ratio of a minimum distance to a minimum pattern width is assigned.

FIG. 4 is a plot of changes of RxISO and TxISO obtained when each ratio d/A is assigned as illustrated in Table 1. FIG. 4 illustrates an isolation obtained when a ratio of the minimum distance d to the minimum pattern width A is assigned.

As illustrated in FIG. 4 and Table 1, as the ratio d/A decreases, a capacitance component to be obtained increases and the area of the ground pattern Gp also increases, and RxISO and TxISO therefore are improved. However, it is seen that, when the ratio d/A decreases from about 17.7273 to about 2.6786, the amount by which TxISO is improved is about 0.8 dB, that is, TxISO is less improved. On the other hand, it is seen that, when the ratio d/A decreases from about 2.6786 to about 1.5432, the amount by which TxISO is improved is about 3.1 dB, that is, TxISO is greatly improved. Thus, when the ratio d/A is not greater than about 1.55, RxISO and TxISO are able to be more effectively improved.

Furthermore, in the FIG. 4 and Table 1, the minimum distance d is not less than about 0.1 times the minimum pattern width A. For example, when the minimum pattern width A is about 186 μm, the minimum distance d is about 20 μm. A threshold value of a distance between patterns defining the wiring patterns so that electrical conduction does not occur between the wiring patterns is about 20 μm. Thus, when the minimum distance d between the inductor pattern Lp and the ground pattern Gp is exceedingly narrow, electrical conduction is likely to occur between the inductor pattern Lp and the ground pattern Gp, whereas, since the minimum distance d is not less than about 0.1 times the minimum pattern width A, a capacitance component is able to be made larger while reducing or preventing the occurrence of electrical conduction between the inductor pattern Lp and the ground pattern Gp, and the area of the ground pattern Gp is also able to be made larger.

Thus, when the ratio of the minimum distance d to the minimum pattern width A is not greater than about 1.55, both of RxISO and TxISO are able to be improved.

As described above, the minimum distance d between the inductor pattern Lp and the ground pattern Gp is preferably not greater than about 1.55 times the minimum pattern width A in the ground pattern Gp, the minimum distance d thus decreases, and a sufficient capacitance component is therefore able to be obtained by coupling between the inductor pattern Lp and the ground pattern Gp. Thus, an anti-resonance point of the series-arm resonator is able to be adjusted further by LC resonance caused by the capacitance component and an inductance component of the inductor pattern Lp, and an isolation between the first filter and the second filter in the pass band of the second filter is therefore able to be improved further. Furthermore, when the minimum distance d decreases, the area of the ground pattern Gp is able to be increased, and an isolation between the first filter 10 and the second filter 20 in the pass band of the first filter 10 is therefore able to be improved further. Thus, isolation characteristics between the first filter 10 and the second filter 20 are able to be improved further.

Furthermore, in each of the plurality of layers over which the inductor pattern Lp and the ground pattern Gp are provided, since the minimum distance d between the inductor pattern Lp and the ground pattern Gp is not greater than about 1.55 times the minimum pattern width A, a capacitance component increases further, an anti-resonance point of the series-arm resonator is able to be made deeper, and isolation characteristics between the first filter 10 and the second filter 20 are able to be improved further.

Preferred Embodiment 2

The multiplexer 1 according to the Preferred Embodiment 1 described above may be used in a high-frequency front-end circuit and also in a communication device including the high-frequency front-end circuit. Thus, in the present preferred embodiment, such a high-frequency front-end circuit and such a communication device will be described.

Figure 5:
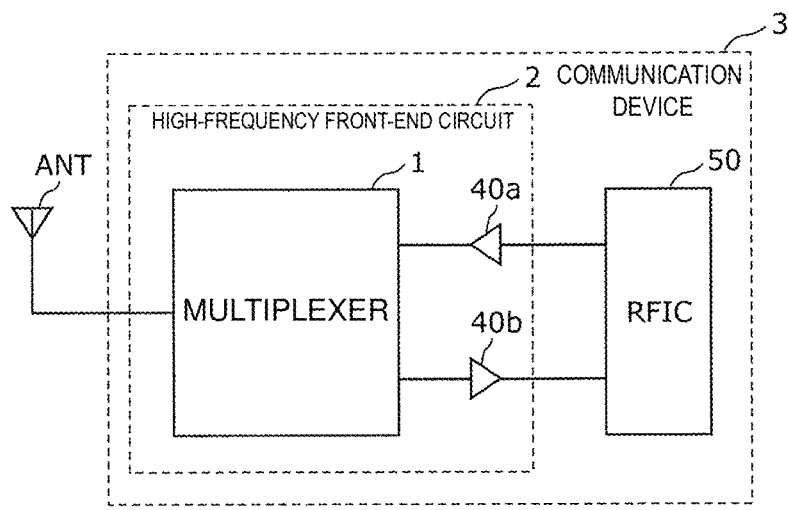
FIG. 5 illustrates a circuit configuration of a high-frequency front-end circuit and a communication device according to a Preferred Embodiment 2 of the present invention.

FIG. 5 illustrates a circuit configuration of a high-frequency front-end circuit 2 and a communication device 3 according to a Preferred Embodiment 2 of the present invention. This figure also illustrates the antenna element ANT connected to the communication device 3. The high-frequency front-end circuit and an RF signal processing circuit (RFIC) 50 define the communication device 3.

The high-frequency front-end circuit 2 includes the multiplexer 1, and amplifier circuits connected to the multiplexer 1. Here, as amplifier circuits, a power amplifier 40a and a low noise amplifier 40b are illustrated.

The power amplifier 40a is a transmission amplifier circuit that amplifies a radio frequency signal (radio frequency transmission signal) output from the RF signal processing circuit 50 and outputs the radio frequency signal to the antenna element ANT through the multiplexer 1.

The low noise amplifier 40b is a reception amplifier circuit that amplifies a radio frequency signal (radio frequency reception signal) having passed through the antenna element ANT and the multiplexer 1 and outputs the radio frequency signal to the RF signal processing circuit 50.

The RF signal processing circuit 50 performs, through down-converting or the like, signal processing on a radio frequency reception signal input from the antenna element ANT through the high-frequency front-end circuit 2 and outputs a reception signal generated by performing the signal processing to a baseband signal processing circuit. Furthermore, the RF signal processing circuit 50 performs, through up-converting or the like, signal processing on a radio frequency transmission signal input from the baseband signal processing circuit and outputs a radio frequency transmission signal generated by performing the signal processing to the antenna element ANT through the high-frequency front-end circuit 2.

The high-frequency front-end circuit 2 may include another circuit element between the above-described components.

The high-frequency front-end circuit 2 and the communication device 3 configured as described above enable further improvement in isolation characteristics by including the multiplexer 1 according to the Preferred Embodiment 1.

Although the multiplexers, the high-frequency front-end circuits, and the communication devices according to the preferred embodiments of the present invention have been described with reference to the above-described preferred embodiments, the present invention is not limited to the above-described preferred embodiments. The present invention also covers other preferred embodiments achieved by combining any components in the above-described preferred embodiments, and modifications obtained by making various modifications conceived by a person skilled in the art to the above-described preferred embodiments within the scope and gist of the present invention.

For example, although, in the above-described preferred embodiments, as the multiplexer 1, an example of a circuit has been described in which the first filter 10 provided in the transmission signal path and the second filter 20 provided in the reception signal path are connected to the common connection point N, the present invention may also be applied to a circuit in which both of the first filter 10 and the second filter 20 are provided in the transmission signal path or the reception signal path, or applied to a circuit in which three or more signal paths are connected to the common connection point N.

Furthermore, for example, although, in the above-described preferred embodiments, the inductor pattern Lp and the ground pattern Gp that are disposed at the minimum distance d from and adjacent to each other are provided in a plurality of layers (for example, the second to fourth layers) of the board 30, the inductor pattern Lp and the ground pattern Gp need only be provided in at least one layer of the plurality of layers of the board 30.

Furthermore, for example, although, in the above-described preferred embodiments, the board 30 is a multilayer board, the board 30 is not limited to this and may be a single-layer board.

Preferred embodiments of the present invention may be widely used, as a multiplexer, a high-frequency front-end circuit, and a communication device, which are suitable for use in a multiband system, in communication equipment, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a first filter that is a ladder elastic wave filter including a series-arm resonator and a parallel-arm resonator;
   a second filter connected to the first filter at a common connection point; and
   a board including an inductor pattern defining an inductor connected in parallel with the series-arm resonator, and a ground pattern provided in a same layer in which the inductor pattern is provided, so as to be disposed at a distance from and adjacent to the inductor pattern; wherein
   a minimum distance between the inductor pattern and the ground pattern is not greater than about 1.55 times a minimum pattern width in the ground pattern.

2. A high-frequency front-end circuit comprising:
   the multiplexer according to claim 1; and
   an amplifier circuit connected to the multiplexer.

3. A communication device comprising:
   an RF signal processing circuit configured to process radio frequency signals to be transmitted and having been received by an antenna element; and
   the high-frequency front-end circuit according to claim 2 configured to transmit the radio frequency signals between the antenna element and the RF signal processing circuit.

4. The communication device according to claim 3, wherein
   the inductor pattern includes a plurality of linear wiring patterns; and
   at least two linear wiring patterns of the plurality of linear wiring patterns are individually disposed at the minimum distance from and adjacent to the ground pattern.

5. The communication device according to claim 3, wherein
   the inductor pattern and the ground pattern are provided in the board over a plurality of layers; and
   in each of the plurality of layers, the inductor pattern and the ground pattern are disposed at the minimum distance from and adjacent to each other.

6. The communication device according to claim 3, wherein the minimum distance is not less than about 0.1 times the minimum pattern width.

7. The communication device according to claim 3, wherein the series-arm resonator and the parallel-arm resonator are each surface acoustic wave resonators.

8. The communication device according to claim 3, wherein the second filter is a longitudinally coupled filter including a series-arm resonator and a longitudinally coupled resonator.

9. The high-frequency front-end circuit according to claim 2, wherein
the inductor pattern includes a plurality of linear wiring patterns; and
at least two linear wiring patterns of the plurality of linear wiring patterns are individually disposed at the minimum distance from and adjacent to the ground pattern.

10. The high-frequency front-end circuit according to claim 2, wherein
the inductor pattern and the ground pattern are provided in the board over a plurality of layers; and
in each of the plurality of layers, the inductor pattern and the ground pattern are disposed at the minimum distance from and adjacent to each other.

11. The high-frequency front-end circuit according to claim 2, wherein the minimum distance is not less than about 0.1 times the minimum pattern width.

12. The high-frequency front-end circuit according to claim 2, wherein the series-arm resonator and the parallel-arm resonator are each surface acoustic wave resonators.

13. The high-frequency front-end circuit according to claim 2, wherein the second filter is a longitudinally coupled filter including a series-arm resonator and a longitudinally coupled resonator.

14. The high-frequency front-end circuit according to claim 2, further comprising a matching inductor connected between the common connection point and ground.

15. The multiplexer according to claim 1, wherein
the inductor pattern includes a plurality of linear wiring patterns; and
at least two linear wiring patterns of the plurality of linear wiring patterns are individually disposed at the minimum distance from and adjacent to the ground pattern.

16. The multiplexer according to claim 1, wherein
the inductor pattern and the ground pattern are provided in the board over a plurality of layers; and
in each of the plurality of layers, the inductor pattern and the ground pattern are disposed at the minimum distance from and adjacent to each other.

17. The multiplexer according to claim 1, wherein the minimum distance is not less than about 0.1 times the minimum pattern width.

18. The multiplexer according to claim 1, wherein the series-arm resonator and the parallel-arm resonator are each surface acoustic wave resonators.

19. The multiplexer according to claim 1, wherein the second filter is a longitudinally coupled filter including a series-arm resonator and a longitudinally coupled resonator.

20. The multiplexer according to claim 1, further comprising a matching inductor connected between the common connection point and ground.

* * * * *